(12) United States Patent
Zou

(10) Patent No.: US 12,082,471 B2
(45) Date of Patent: Sep. 3, 2024

(54) DISPLAY PANEL IMPROVING LUMINOUS EFFICIENCY OF LIGHT-EMITTING DEVICE, AND DISPLAY MODULE WITH THE SAME

(71) Applicant: WUHAN CHINA STAR OPTOELECTRONICS SEMICONDUCTOR DISPLAY TECHNOLOGY CO., LTD., Wuhan (CN)

(72) Inventor: Wei Zou, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 0 days.

(21) Appl. No.: 17/434,680

(22) PCT Filed: Aug. 4, 2021

(86) PCT No.: PCT/CN2021/110479
§ 371 (c)(1),
(2) Date: Aug. 27, 2021

(87) PCT Pub. No.: WO2023/000385
PCT Pub. Date: Jan. 26, 2023

(65) Prior Publication Data
US 2024/0023400 A1 Jan. 18, 2024

(30) Foreign Application Priority Data
Jul. 21, 2021 (CN) .......................... 202110823378.1

(51) Int. Cl.
*H10K 59/35* (2023.01)
*H10K 50/13* (2023.01)
*H10K 59/122* (2023.01)

(52) U.S. Cl.
CPC .......... *H10K 59/352* (2023.02); *H10K 50/13* (2023.02); *H10K 59/122* (2023.02)

(58) Field of Classification Search
CPC ..... H10K 59/352; H10K 50/13; H10K 59/122
See application file for complete search history.

(56) References Cited

U.S. PATENT DOCUMENTS

2017/0084856 A1* 3/2017 Kum ................ H10K 59/32
2020/0243631 A1* 7/2020 Wu ................... H10K 50/82
(Continued)

FOREIGN PATENT DOCUMENTS

| CN | 104409470 A | 3/2015 |
| CN | 104882465 A | 9/2015 |

(Continued)

OTHER PUBLICATIONS

Chinese Office Action issued in corresponding Chinese Patent Application No. 202110823378.1 dated May 19, 2022, pp. 1-6.
(Continued)

*Primary Examiner* — Nduka E Ojeh
(74) *Attorney, Agent, or Firm* — PV IP PC; Wei Te Chung; Zhigang Ma

(57) ABSTRACT

A display panel and a display module are provided. The display panel has a plurality of first light-emitting devices displaying a first color, a plurality of second light-emitting devices displaying a second color, and a plurality of third light-emitting devices displaying a third color, wherein the display panel has a plurality of light-emitting repeating units, and at least one first sub-pixel of each of the plurality of light-emitting repeating units comprises at least two of the
(Continued)

first light-emitting devices, the second light-emitting devices, or the third light-emitting devices, all of which are arranged in a stack.

18 Claims, 3 Drawing Sheets

(56) References Cited

U.S. PATENT DOCUMENTS

| | | | |
|---|---|---|---|
| 2021/0202599 A1* | 7/2021 | Kristal | H10K 50/15 |
| 2022/0328582 A1* | 10/2022 | Lee | H10K 59/122 |
| 2022/0376004 A1* | 11/2022 | Kitazawa | H10K 59/122 |

FOREIGN PATENT DOCUMENTS

| | | |
|---|---|---|
| CN | 106373988 A | 2/2017 |
| CN | 107146806 A | 9/2017 |
| CN | 109599420 A | 4/2019 |
| CN | 110323259 A | 10/2019 |
| CN | 112786669 A | 5/2021 |
| KR | 20090131404 A | 12/2009 |

OTHER PUBLICATIONS

International Search Report in International application No. PCT/CN2021/110479, mailed on Apr. 19, 2022.
Written Opinion of the International Searching Authority in International application No. PCT/CN2021/110479, mailed on Apr. 19, 2022.

\* cited by examiner

DISPLAY PANEL IMPROVING LUMINOUS EFFICIENCY OF LIGHT-EMITTING DEVICE, AND DISPLAY MODULE WITH THE SAME

RELATED APPLICATIONS

This application is a Notional Phase of PCT Patent Application No. PCT/CN2021/110479 having international filing date of Aug. 4, 2021, which claims the benefit of priority of Chinese Patent Application No. 202110823378.1 filed on Jul. 21, 2021. The contents of the above applications are all incorporated by reference as if fully set forth herein in their entirety.

FIELD OF DISCLOSURE

The present disclosure relates to displays, and more particularly to a display panel and a display module.

BACKGROUND OF DISCLOSURE

In flat panel display technology, an organic light-emitting diode (OLED) display has many advantages such as thinness, active light emission, fast response speed, large viewing angle, wide color gamut, high brightness, and low power consumption, which gradually becomes a third-generation display technology after the liquid crystal display.

However, current organic light-emitting diode displays are difficult to achieve further breakthroughs in a service life of OLED displays due to a limitation of light-emitting materials. Therefore, the current OLED display has a technical problem of low service life.

Therefore, there is an urgent need for a display panel to solve the above technical problems.

SUMMARY OF DISCLOSURE

The present application provides a display panel and a display module to alleviate a technical problem of low service life of an existing display panel.

The present application provides a display panel comprising a plurality of first light-emitting devices displaying a first color, a plurality of second light-emitting devices displaying a second color, and a plurality of third light-emitting devices displaying a third color,
   wherein the display panel comprises a plurality of light-emitting repeating units, and each of the light-emitting repeating units comprises:
   at least one first sub-pixel, wherein the first sub-pixel comprises at least two of the first light-emitting devices, the second light-emitting devices, or the third light-emitting devices, all of which are arranged in a stack.

In a display panel of the present application, each of the light-emitting repeating units further comprises a second sub-pixel, wherein the first sub-pixel is arranged at a center of a virtual rectangle, and the second sub-pixel is arranged in an area of the virtual rectangular and is close to a vertex of the virtual rectangle; or the first sub-pixel and the second sub-pixel are arranged in the virtual rectangle, the first sub-pixel is arranged close to two vertices on a first oblique line in the virtual rectangle, the second sub-pixel is arranged close to two vertices on a second oblique line in the virtual rectangle, and the first oblique line and the second oblique line intersect.

In a display panel of the present application, the first sub-pixel includes the first light-emitting device and the second light-emitting device arranged in a stack, and the second sub-pixel includes the third light-emitting device,
   wherein in a light-emitting direction of the display panel, transmittances of transmissive materials provided on both sides of the first light-emitting device and the second light-emitting device are different.

In a display panel of the present application, the display panel comprises a first anode layer, the first light-emitting device provided on the first anode layer, a first cathode layer provided on the first light-emitting device, the second light-emitting device arranged on the first cathode layer, and a second anode layer arranged on the second light-emitting device,
   wherein a transmittance of the first anode layer is less than transmittances of the first cathode layer and the second anode layer; or, a transmittance of the second anode layer is less than the transmittances of the first cathode layer and the first anode layer.

In a display panel of the present application, the display panel comprises an array substrate and a pixel definition layer provided on the array substrate, and the pixel definition layer is provided in a same layer as a plurality of sub-pixels;
   wherein the array substrate at least comprises a first thin film transistor and a second thin film transistor, the first anode layer is connected to the first thin film transistor through a first via hole, and the second anode layer is connected to the second thin film transistor in the array substrate through a second via hole; and
   wherein the first via hole is provided in the array substrate, and the second via hole penetrates through a first portion of the pixel definition layer and extends to an inside of the array substrate.

In a display panel of the present application, the third light-emitting device is spaced apart from the first light-emitting device and the second light-emitting device, wherein the first light-emitting device and the second light-emitting device are arranged in a stack;
   wherein in the light-emitting direction of the display panel, a sum of a thickness of the first light-emitting device, the second light-emitting device, and a cathode layer on the second light-emitting device layer is equal to a thickness of the third light-emitting device.

In a display panel of the present application, in a top view direction of the display panel, a light-emitting area of the third light-emitting device is larger than a light-emitting area of the first light-emitting device or the second light-emitting device.

In a display panel of the present application, the first sub-pixel comprises the first light-emitting device, the second light-emitting device, and the third light-emitting device, all of which are arranged in a stack; wherein the first sub-pixel is arranged in an array on the display panel.

In a display panel of the present application, thicknesses of the first light-emitting device, the second light-emitting device, and the third light-emitting device are different from each other.

In a display panel of the present application, a ratio of a sum of a thickness of each film layer in the first light-emitting device, the second light-emitting device, and the third light-emitting device to a wavelength of a corresponding light-emitting color is 0.5n:1, and n is a positive integer.

In a display module of the present application, the display module comprises a display panel, a polarizer layer provided on the display panel, and a cover layer provided on the polarizer layer, wherein the display panel comprises a plurality of first light-emitting devices displaying a first color, a plurality of second light-emitting devices displaying a second color, and a plurality of third light-emitting devices displaying a third color; and wherein the display panel comprises a plurality of light-emitting repeating units, and each of the light-emitting repeating units comprises:

at least one first sub-pixel, wherein the first sub-pixel comprises at least two of the first light-emitting devices, the second light-emitting devices, or the third light-emitting devices, all of which are arranged in a stack.

In a display module of the present application, each of the light-emitting repeating units further comprises a second sub-pixel, wherein the first sub-pixel is arranged at a center of a virtual rectangle, and the second sub-pixel is arranged in an area of the virtual rectangular and is close to a vertex of the virtual rectangle; or the first sub-pixel and the second sub-pixel are arranged in the virtual rectangle, the first sub-pixel is arranged close to two vertices on a first oblique line in the virtual rectangle, the second sub-pixel is arranged close to two vertices on a second oblique line in the virtual rectangle, and the first oblique line and the second oblique line intersect.

In a display module of the present application, the first sub-pixel includes the first light-emitting device and the second light-emitting device arranged in a stack, and the second sub-pixel includes the third light-emitting device, wherein in a light-emitting direction of the display panel, transmittances of transmissive materials provided on both sides of the first light-emitting device and the second light-emitting device are different.

In a display module of the present application, the display panel comprises a first anode layer, the first light-emitting device provided on the first anode layer, a first cathode layer provided on the first light-emitting device, the second light-emitting device arranged on the first cathode layer, and a second anode layer arranged on the second light-emitting device, wherein a transmittance of the first anode layer is less than transmittances of the first cathode layer and the second anode layer; or, a transmittance of the second anode layer is less than the transmittances of the first cathode layer and the first anode layer.

In a display module of the present application, the display panel comprises an array substrate and a pixel definition layer provided on the array substrate, and the pixel definition layer is provided in a same layer as a plurality of sub-pixels;

wherein the array substrate at least comprises a first thin film transistor and a second thin film transistor, the first anode layer is connected to the first thin film transistor through a first via hole, and the second anode layer is connected to the second thin film transistor in the array substrate through a second via hole; and wherein the first via hole is provided in the array substrate, and the second via hole penetrates through a first portion of the pixel definition layer and extends to an inside of the array substrate.

In a display module of the present application, the third light-emitting device is spaced apart from the first light-emitting device and the second light-emitting device, wherein the first light-emitting device and the second light-emitting device are arranged in a stack;

wherein in the light-emitting direction of the display panel, a sum of a thickness of the first light-emitting device, the second light-emitting device, and a cathode layer on the second light-emitting device layer is equal to a thickness of the third light-emitting device.

In a display module of the present application, in a top view direction of the display panel, a light-emitting area of the third light-emitting device is larger than a light-emitting area of the first light-emitting device or the second light-emitting device.

In a display module of the present application, the first sub-pixel comprises the first light-emitting device, the second light-emitting device, and the third light-emitting device, all of which are arranged in a stack; wherein the first sub-pixel is arranged in an array on the display panel.

In a display module of the present application, thicknesses of the first light-emitting device, the second light-emitting device, and the third light-emitting device are different from each other.

In a display module of the present application, a ratio of a sum of a thickness of each film layer in the first light-emitting device, the second light-emitting device, and the third light-emitting device to a wavelength of a corresponding light-emitting color is 0.5n:1, and n is a positive integer.

The present application comprises a display panel and a display module. The display panel comprises a plurality of first light-emitting devices displaying a first color, a plurality of second light-emitting devices displaying a second color, and a plurality of third light-emitting devices displaying a third color, wherein the display panel comprises a plurality of light-emitting repeating units, and at least one first sub-pixel of each of the plurality of light-emitting repeating units comprises at least two of the first light-emitting devices, the second light-emitting devices, or the third light-emitting devices, all of which are arranged in a stack. In the present application, at least two stacked light-emitting devices with different light-emitting colors are arranged in a sub-pixel, such that a luminous brightness of the light-emitting device can be improved under a condition that the light-emitting area remains unchanged. A luminous efficiency of the light-emitting device is improved, and a service life of the display panel is prolonged.

DETAILED DESCRIPTION OF PREFERRED EMBODIMENTS

Figure 1:
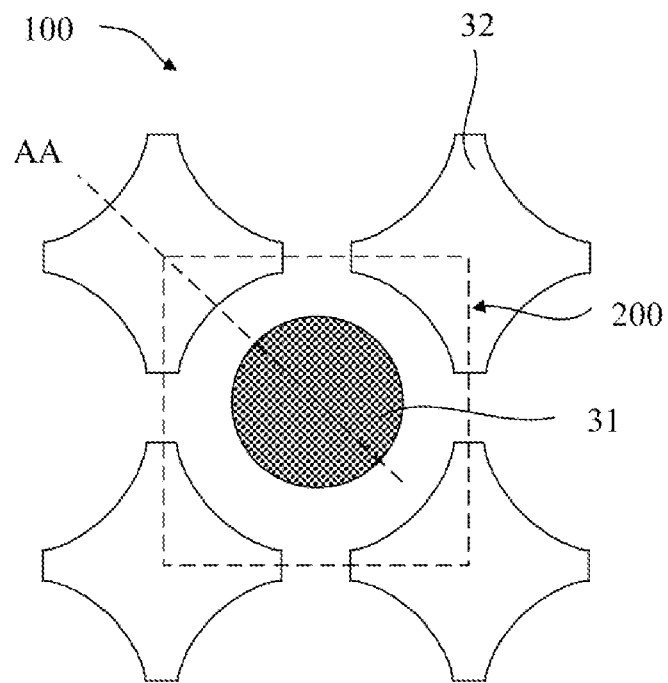
FIG. 1 is an arrangement diagram of a first type of pixel structure of a display panel of the present application.

Organic light-emitting OLED displays cannot achieve a further breakthrough in the service life of OLED displays due to the limitation of light-emitting materials, which makes current OLED displays have a technical problem of low service life. This application provides following technical solutions to solve above technical problems.

Please refer to FIG. 1 to FIG. 6, the present application provides a display panel 100, which includes a plurality of first light-emitting devices 21 displaying a first color, a plurality of second light-emitting devices 22 displaying a second color, and a plurality of third light-emitting devices 23 displaying a third color.

In the present embodiment, the display panel 100 further includes a plurality of light-emitting repeating units 200. Each of the light-emitting repeating units 200 includes at least one first sub-pixel 31. The first sub-pixel 31 includes at least two of the first light-emitting device 21, the second light-emitting device 22, or the third light-emitting device 23, all of which are arranged in a stack.

In the present application, at least two stacked light-emitting devices with different light-emitting colors are arranged in a sub-pixel, such that a luminous brightness of the light-emitting device can be improved under a condition that the light-emitting area remains unchanged. A luminous efficiency of the light-emitting device is improved, and a service life of the display panel 100 is prolonged.

The technical solution of the present application will now be described in conjunction with specific embodiments.

In the display panel 100 of the present application, each of the light-emitting repeating units 200 further includes a second sub-pixel 32. The first sub-pixel 31 is arranged at a center of a virtual rectangle, and the second sub-pixel is arranged in an area of the virtual rectangular and close to a vertex of the virtual rectangle.

Refer to FIG. 1. FIG. 1 is a structure diagram of a first type of pixel arrangement in a display panel of the present application. Since at least two stacked light-emitting devices with different light-emitting colors are provided in the first sub-pixel 31, a corresponding pixel arrangement structure will change.

For example, the first sub-pixel 31 in FIG. 1 may include a first light-emitting device 21 displaying a first color and a second light-emitting device 22 displaying a second color, both of which are arranged in a stack. The second sub-pixel 32 may include a third light-emitting device 23 that displays a third color.

In the present embodiment, one light-emitting repeating unit corresponds to a virtual rectangle in the figure, and the light-emitting repeating units 200 are repeatedly arranged on the display panel. One light-emitting repeating unit 200 may include one first sub-pixel 31 and four quarter-sized second sub-pixels 32, and four quarter-sized second sub-pixels 32 may be equivalent to one second sub-pixel 32.

In the present embodiment, the first sub-pixel 31 may be arranged at a center of a virtual rectangle, and the second sub-pixel 32 may be arranged in an area of the virtual rectangle and close to the vertex of the virtual rectangle.

Each second sub-pixel 32 with a size of a quarter is arranged on a vertex of the virtual rectangle.

In the present embodiment, the first sub-pixel 31 and the second sub-pixel 32 may also be arranged in the virtual rectangle. The first sub-pixel 31 is arranged close to two vertices on a first oblique line AC in the virtual rectangle. The second sub-pixel 32 is arranged close to two vertices on a second oblique line BD in the virtual rectangle. The first oblique line AC and the second oblique line BD intersect.

Figure 2:
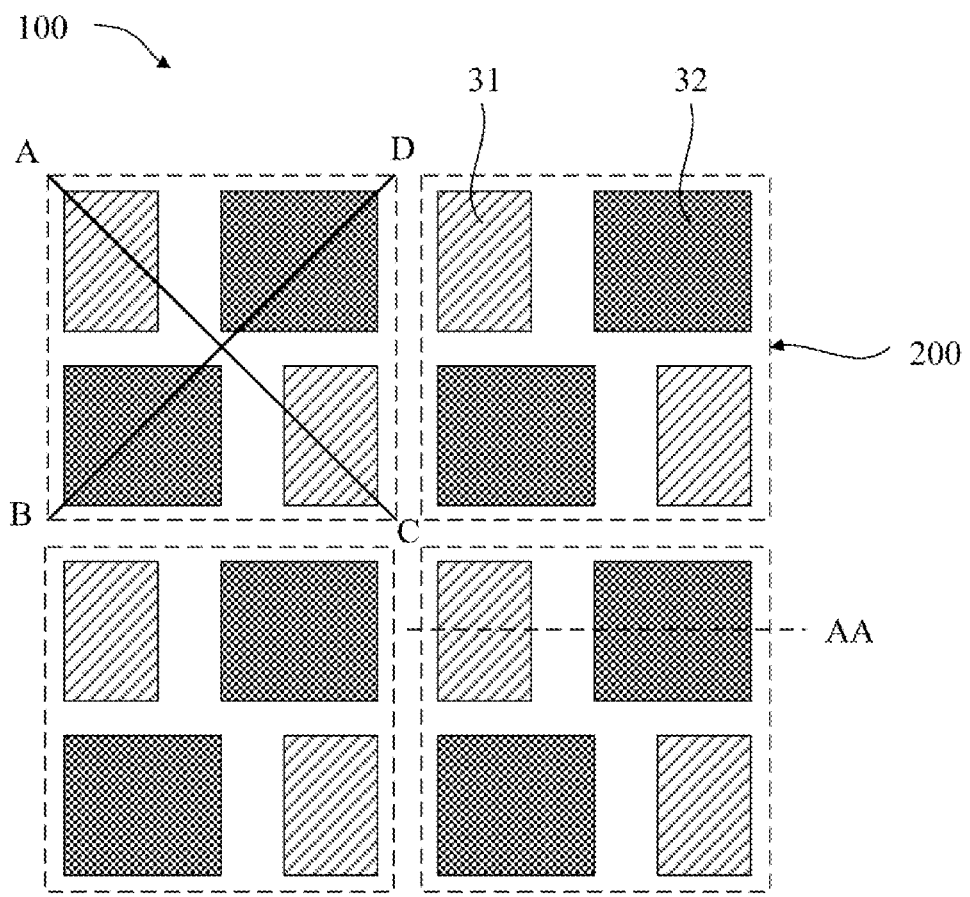
FIG. 2 is an arrangement diagram of a second type of pixel structure of a display panel of the present application.

Referring to FIG. 2, one of the light-emitting repeating units 200 corresponds to a virtual rectangle in the figure, and the light-emitting repeating units 200 are repeatedly arranged on the display panel. One light-emitting repeating unit 200 may include two first sub-pixels 31 and two second sub-pixels 32.

In this embodiment, the virtual rectangle includes a first vertex A, a second vertex B, a third vertex C, and a fourth vertex D. A line connecting the first vertex A and the third vertex C is the first oblique line AC, and a line connecting the second vertex B and the fourth vertex D is the second oblique line BD. The two first sub-pixels 31 are arranged close to the first vertex A and the third vertex C, and the two second sub-pixels 32 are arranged close to the second vertex B and the fourth vertex D.

In the structure of FIG. 1 and FIG. 2, since one first sub-pixel 31 includes two light-emitting devices arranged in a stack, and on the display panel, it is equivalent to only two types of sub-pixels are repeatedly arranged.

It can enable the light-emitting device to improve a light-emitting brightness of the light-emitting device under a condition that the light-emitting area is unchanged, so as to improve the light-emitting efficiency of the light-emitting device, and to extend the service life of the display panel 100.

Figure 3:
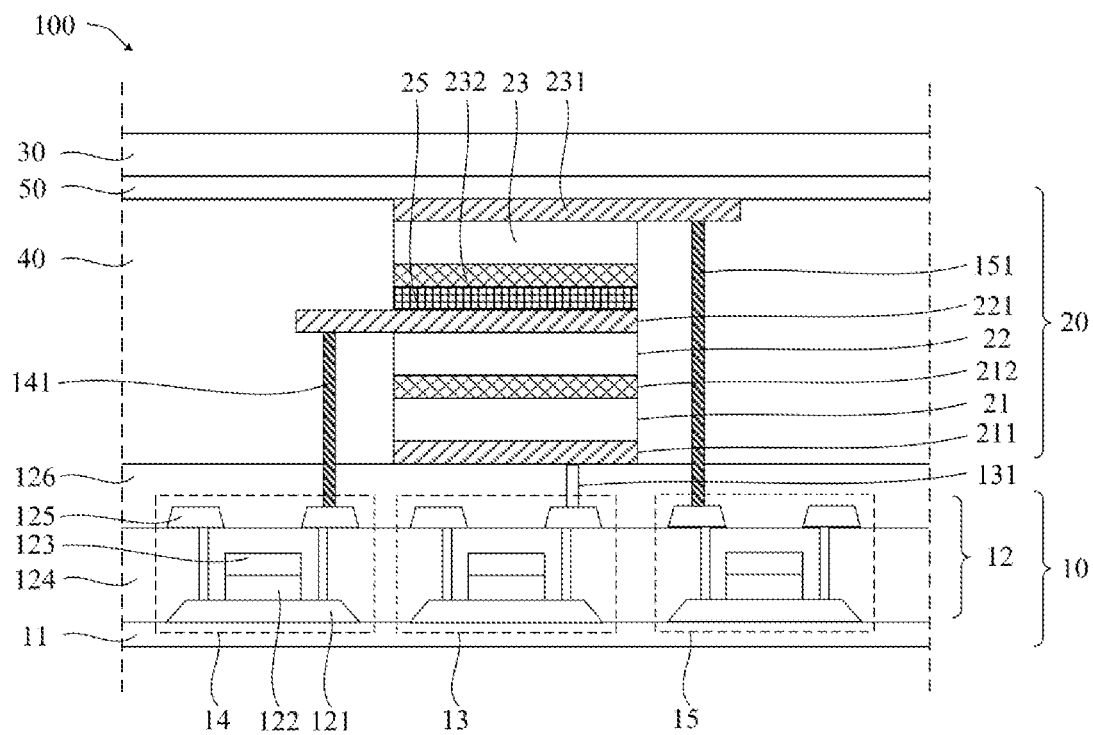
FIG. 3 is a cross-sectional view of section AA in FIG. 1 or FIG. 2.

Refer to FIG. 3, which is a cross-sectional view of section AA in FIG. 1 or FIG. 2. The display panel 100 may include an array substrate 10, a light-emitting function layer 20 disposed on the array substrate 10, and an encapsulation layer 30 on the light-emitting function layer 20.

In the present embodiment, the array substrate 10 may include a substrate 11 and a driving circuit layer 12 located on the substrate 11. The substrate 11 may be a flexible substrate or a rigid substrate. When the substrate 11 is a rigid substrate, material of the substrate 11 may be made of glass, quartz and other materials. When the substrate 11 is a flexible substrate, material of the substrate 11 may be a material such as polyimide.

In this embodiment, the driving circuit layer 12 may include a plurality of thin film transistors. The thin film transistor may be of an etch barrier type, a back channel etch type, or a top gate thin film transistor type, and there is no specific limitation. For example, a top gate thin film transistor may include: an active layer 121 located on the substrate 11; a gate insulating layer 122 located on the active layer 121, a gate layer 123 located on the gate insulating layer 122; an inter-insulating layer 124 located on the gate layer 123; a source and drain layer 125 located on the inter-insulating layer 124; and a flat layer 126 located on the source and drain layer 125.

In the present embodiment, the above-mentioned top gate thin film transistor is not limited to a single-gate structure and can also be configured as a double-gate structure or the like.

In the display panel 100 of the present application, the light-emitting function layer 20 may include a plurality of first sub-pixels. At least one of the first sub-pixels includes a first light-emitting device 21 and a second light-emitting device 22 disposed on the first light-emitting device 21. The first light-emitting device 21 and the second light-emitting device 22 may be two different types of a red light-emitting device, a green light-emitting device, or a blue light-emitting device, which are not specifically limited in this application.

In this embodiment, in the light-emitting direction of the display panel 100, the transmittances of the transmissive materials provided on both sides of the first light-emitting device 21 and the second light-emitting device 22 are different.

Referring to FIG. 3, the first sub-pixel may include: a first anode layer 211 disposed on the array substrate 10, a first light-emitting device 21 disposed on the first anode layer 211, a first cathode layer 212 disposed on the first light-emitting device 21, a second light-emitting device 22 disposed on the first cathode layer 212, and a second anode layer 221 is disposed on the second light-emitting device 22.

In the present embodiment, the first anode layer 211 is disposed on the flat layer 126. The first anode layer 211 and the second anode layer 221 are mainly used to provide holes for absorbing electrons. The first cathode layer 212 is used to provide electrons required by the first light-emitting device 21 and the second light-emitting device 22, i.e., the first light-emitting device 21 and the second light-emitting device 22 share the first cathode layer 212.

In this embodiment, when the display panel 100 is of a top emission type, the transmittance of the first anode layer 211 needs to be sufficiently small, since the second light-emitting device 22 is disposed on the first light-emitting device 21, e.g., the first anode layer 211 may be composed of a total reflection material. Since the second anode layer 221 is on a light-emitting side, the transmittance of the second anode layer 221 needs to be greater than the transmittance of the first anode layer 211.

In this embodiment, the first anode layer 211 may be made of a total reflection material, and the second anode layer 221 may be made of a semi-reflection material. A microcavity composed of total reflection and semi-reflection can improve the luminous efficiency of the light-emitting device located between the two. In order to ensure a microcavity effect of the first light-emitting device 21 and the second light-emitting device 22, the first cathode layer 212 may be composed of a semi-reflection material, and the transmittance of the first cathode layer 212 may be less than or equal to the transmittance of the second anode layer 221.

In this embodiment, the microcavity formed by two film layers with a certain difference in transmittance can better realize the microcavity effect. For example, the first anode layer 211 is used as a total reflection and the second anode layer 221 is used as a semi-reflection. Therefore, in the present application the transmittance of the first cathode layer 212 is smaller than the transmittance of the second anode layer 221, such that the transmittances of the first cathode layer 212 and the second anode layer 221 have a certain difference, and the luminous efficiency of the second light-emitting device 22 is improved.

In the present embodiment, the first anode layer 211 and the first cathode layer 212 constitute a microcavity of the first light-emitting device 21; the first cathode layer 212 and the second anode layer 221 constitute the microcavity of the second light-emitting device 22; and the first anode layer 211 and the second anode layer 221 constitute the microcavities of the first light-emitting device 21 and the second light-emitting device 22. The light emitted by the first light-emitting device 21 and the second light-emitting device 22 is superimposed by the two microcavities to improve the luminous efficiency of the first light-emitting device 21 and the second light-emitting device 22. Compared with the current technology, the first light-emitting device 21 and the second light-emitting device 22 can achieve a same brightness at a lower current, so as to prolong the service life of the first light-emitting device 21 and the second light-emitting device 22. At the same time, the structure of the first light-emitting device 21 and the second light-emitting device 22 reduces an area occupied by one sub-pixel and improves the pixel density of the display panel 100. In the case of displaying the same picture, the use time of each sub-pixel is further reduced.

In this embodiment, when the display panel 100 is of a bottom emission type, since the second light-emitting device 22 is disposed on the first light-emitting device 21, the transmittance of the second anode layer 221 needs to be sufficiently small. For example, the second anode layer 221 may be composed of a total reflection material. Since the first anode layer 211 is at a light-emitting side, the transmittance of the first anode layer 211 needs to be greater than the transmittance of the second anode layer 221. The transmittance of the first cathode layer 212 may be less than or equal to the transmittance of the first anode layer 211. The specific working principle is the same as that of the top emission type and will not be repeated here.

Referring to FIG. 3, the display panel 100 further includes a pixel definition layer 40 provided in a same layer as the light-emitting function layer 20, and the pixel definition layer 40 is located on the flat layer 126. The pixel defining layer 40 includes a plurality of pixel openings, and at least one light-emitting device is arranged in one pixel opening. For example, among two pixel openings shown in FIG. 3, the first light-emitting device 21 and the second light-emitting device 22 are arranged in one pixel opening. In order to ensure a flatness of the film layer, a thickness of the pixel definition layer 40 is generally the same as a thickness of the light-emitting function layer 20.

Referring to FIG. 3, the second light-emitting device 22 is disposed on the first light-emitting device 21. The first anode layer 211 connected to the first light-emitting device 21 and the second anode layer 221 connected to the second light-emitting device 22 need to be connected to the thin film transistor in the array substrate 10, so as to perform driving signal input of the first anode layer 211 and the second anode layer 221.

In the present embodiment, the driving circuit layer 12 at least includes a first thin film transistor 13 and a second thin film transistor 14. The first anode layer 211 is connected to the first thin film transistor 13 through a first via hole 131, and the second anode layer 221 is connected to the second thin film transistor 14 in the array substrate 10 through a second via hole 141. The first via hole 131 is disposed in the array substrate 10, and the second via hole 141 penetrates a first portion of the pixel definition layer 40 and extends to an inside of the array substrate 10.

Referring to FIG. 3, the first via hole 131 penetrates the flat layer 126 of the array substrate 10, and the first anode layer 211 is electrically connected to a source and drain layer 125 of the first thin film transistor 13 through the first via 131. The second via hole 141 penetrates the first portion of the pixel definition layer 40 and the flat layer 126, and the second anode layer 221 is electrically connected to the source and drain layer 125 of the second thin film transistor 14 through the second via hole 141.

In this embodiment, the anode layer connected to the first light-emitting device 21 and the second light-emitting device 22 is connected to different thin film transistors. Different thin film transistors provide different driving signals for the first light-emitting device 21 and the second light-emitting device 22, so as to adjust the light-emitting brightness of the first light-emitting device 21 and the second light-emitting device 22 in multiple dimensions. A display image quality of the first light-emitting device 21 and the second light-emitting device 22 is improved.

In this embodiment, since the cathode layer is usually connected to a constant voltage source, the first light-emitting device 21 and the second light-emitting device 22 may share the first cathode layer 212. Since the first cathode layer 212 is provided on the entire surface, the second via hole 141 will penetrate the first cathode layer 212. In order to avoid a short circuit of the first cathode layer 212 and the second anode layer 221, before forming the first cathode layer 212 and forming the second via hole 141, a layer of organic material with a large surface energy is formed in an area corresponding to the second via hole 141, such that a cathode material cannot be formed on the surface of the organic material. Further, a laser etching process is used to remove the organic material and the pixel definition layer 40 located under the organic material simultaneously, so as to form the second via hole 141 and expose the metal traces under the second via hole 141 and to complete an electrical connection between the second anode layer 221 and the second thin film transistor 14.

Figure 5:
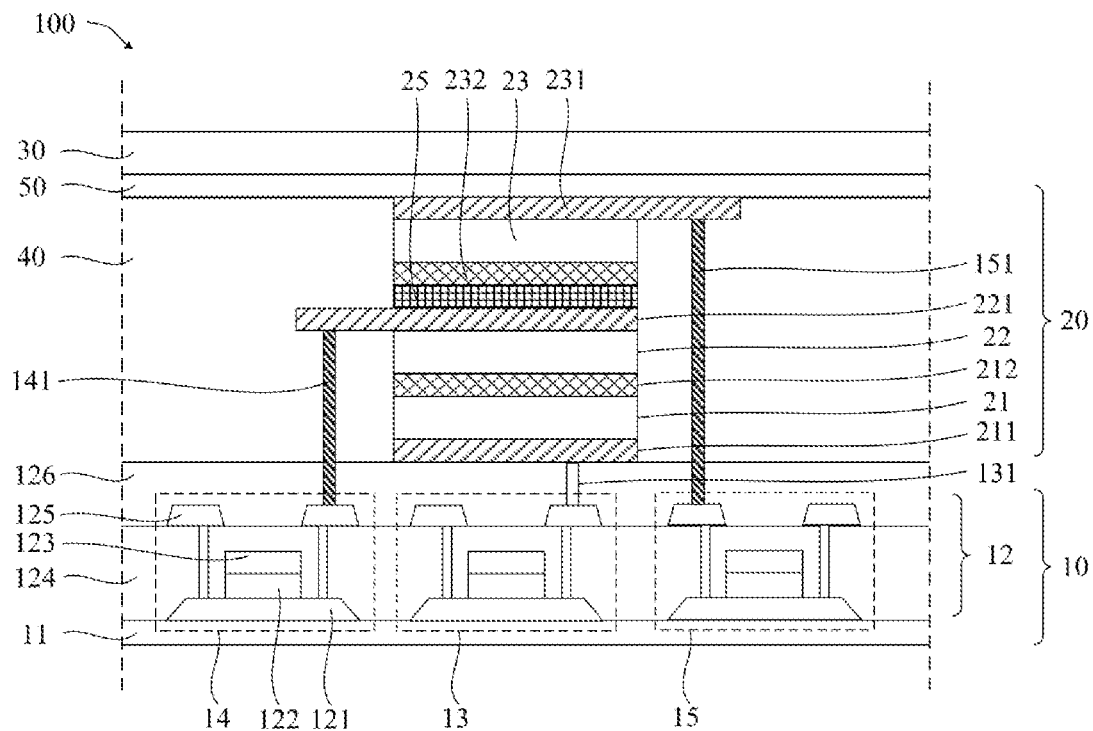
FIG. 5 is a cross-sectional view of section BB in FIG. 4.

Referring to FIG. 3 and FIG. 5, the light-emitting functional layer 20 further includes a third light-emitting device 23. A light-emitting color of the third light-emitting device 23 is different from light-emitting colors of the first light-emitting device 21 and the second light-emitting device 22, and thicknesses of the first light-emitting device 21, the second light-emitting device 22, and the third light-emitting device 23 are different from each other.

In this embodiment, the first light-emitting device 21, the second light-emitting device 22, and the third light-emitting device 23 may be different from each other among a red light-emitting device, a green light-emitting device, and a blue light-emitting device.

In this embodiment, due to inherent characteristics of luminescent material, a luminous efficiency, and a luminous life of the red light-emitting device, the green light-emitting device, and the blue light-emitting device are all different. The green light-emitting device has the best light-emitting life and luminous efficiency, and the light-emitting life of the blue light-emitting device is the worst. Therefore, when the thickness is set, a thickness of the blue light-emitting device is greater than a thickness of the red light-emitting device, and a thickness of the red light-emitting device is greater than a thickness of the green light-emitting device. In order to ensure the flatness of the structure of the film layers, in the structure shown in FIG. 3, the first light-emitting device 21 and the second light-emitting device 22 may be a red light-emitting device and a green light-emitting device that are different from each other, and the third light-emitting device 23 may be a blue light-emitting device.

In this embodiment, the third light-emitting device 23 is spaced apart from the first light-emitting device 21 and the second light-emitting device 22. In a light-emitting direction of the display panel 100, a sum of thicknesses of the first light-emitting device 21, the second light-emitting device 22, and the first cathode layer 212 is equal to a thickness of the third light-emitting device 23.

Referring to FIG. 3, a third anode layer 231 on the flat layer 126 and a third cathode layer 232 on the third light-emitting device 23 are provided on both sides of the third light-emitting device 23. The third anode layer 231 and the first anode layer 211 are provided in a same layer. In order to ensure the flatness of the film structure, a thickness of the third cathode layer 232 may be the same as a thickness of the second anode layer 221, and a sum of thicknesses of the first light-emitting device 21, the second light-emitting device 22 and the first cathode layer 212 is equal to a thickness of the third light-emitting device 23.

In this embodiment, the third anode layer 231 is electrically connected to the third thin film transistor 15 in the array substrate 10 through the third via hole 151, and the third via hole 151 and the first via hole 131 are provided in a same layer.

In this embodiment, in order to avoid an interference of light located inside the microcavity, a ratio of a thickness of the microcavity to the wavelength of the corresponding light-emitting color needs to be 0.5n:1. For example, when the first light-emitting device 21 is a red light-emitting device, and the wavelength of the red light is λ, a distance between the first anode layer 211 and the first cathode layer 212 may be 0.5 nλ, and n is a positive integer.

Figure 6:
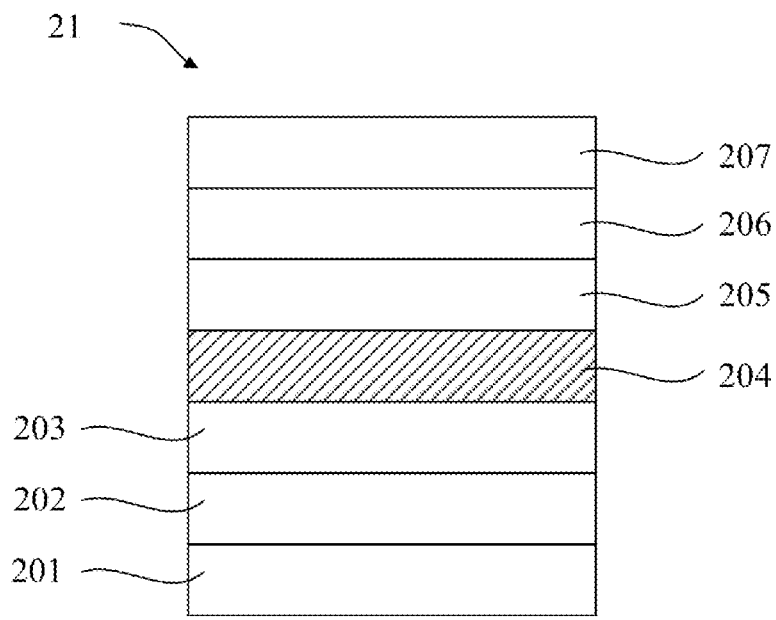
FIG. 6 is a structural diagram of a first light-emitting device in a display panel of the present application.

In addition, since it is necessary to make the luminous efficiency and luminous life of the red light-emitting device, the green light-emitting device, and the blue light-emitting device the same at the same time, it is not feasible to individually adjust the thickness of the light-emitting layer. Referring to FIG. 6, taking the first light-emitting device 21 as an example, the first light-emitting device 21 may include a hole injection layer 201, a hole transport layer 202, an electron blocking layer 203, a light-emitting layer 204, a hole blocking layer 205, an electron transport layer 206, and an electron injection layer 207. Therefore, the present application can adjust a thickness of the hole injection layer 201, the hole transport layer 202, the electron blocking layer 203, the hole blocking layer 205, the electron transport layer 206, and the electron injection layer 207. Under the condition of meeting the thickness of the microcavity, a uniformity of the luminous efficiency and the luminous life of light-emitting devices of different colors can be realized at the same time.

In this embodiment, the first light-emitting device 21, the second light-emitting device 22, and the third light-emitting device 23 can adjust the corresponding hole blocking layer 205 such that the thickness of the light-emitting device meets the limit of the thickness of the microcavity.

In this embodiment, the electron blocking layer 203 and the hole blocking layer 205 can be selectively set according to customer requirements.

In this embodiment, in a top view direction of the display panel 100, the light-emitting area of the third light-emitting device 23 is larger than the light-emitting area of the first light-emitting device 21 or the second light-emitting device 22.

In this embodiment, a light-emitting color of the first light-emitting device 21 is controlled by an input voltage of the first anode layer 211 and the first cathode layer 212, and a light-emitting color of the second light-emitting device 22 is controlled by an input voltage of the first cathode layer 212 and the second anode layer 221. Since the first cathode layer 212 is shared, and the first cathode layer 212 has a constant voltage, the light-emitting color of the first sub-pixel 31 only needs to control the input voltage of the first anode layer 211 and the second anode layer 221. The light-emitting color of the second sub-pixel 32 only needs to control the input voltage of the third anode layer 231. The input voltage of the first anode layer 211 is controlled by the first thin film transistor 13, the input voltage of the second anode layer 221 is controlled by the second thin film transistor 14, and the input voltage of the third anode layer 231 is controlled by the third thin film transistor 15. Therefore, in the present application, the first thin film transistor 13, the second thin film transistor 14, and the third thin film transistor 15 can be individually controlled, that is, the display of the display panel can be realized.

In this embodiment, the first light-emitting device 21 is provided in the first sub-pixel 31, and the second light-emitting device 22 is provided on the first light-emitting device 21. Therefore, the actual area occupied by the first sub-pixel is reduced. Improvement of the luminous efficiency of the first light-emitting device 21 and the second light-emitting device 22 prolongs the service life of the first light-emitting device 21 and the second light-emitting device 22. The third light-emitting device 23 is a separately arranged microcavity structure, which can improve the service life of the third light-emitting device 23 by increasing the light-emitting area of the third light-emitting device 23, so as to maintain consistency in the service life of light-emitting devices of different colors.

Figure 4:
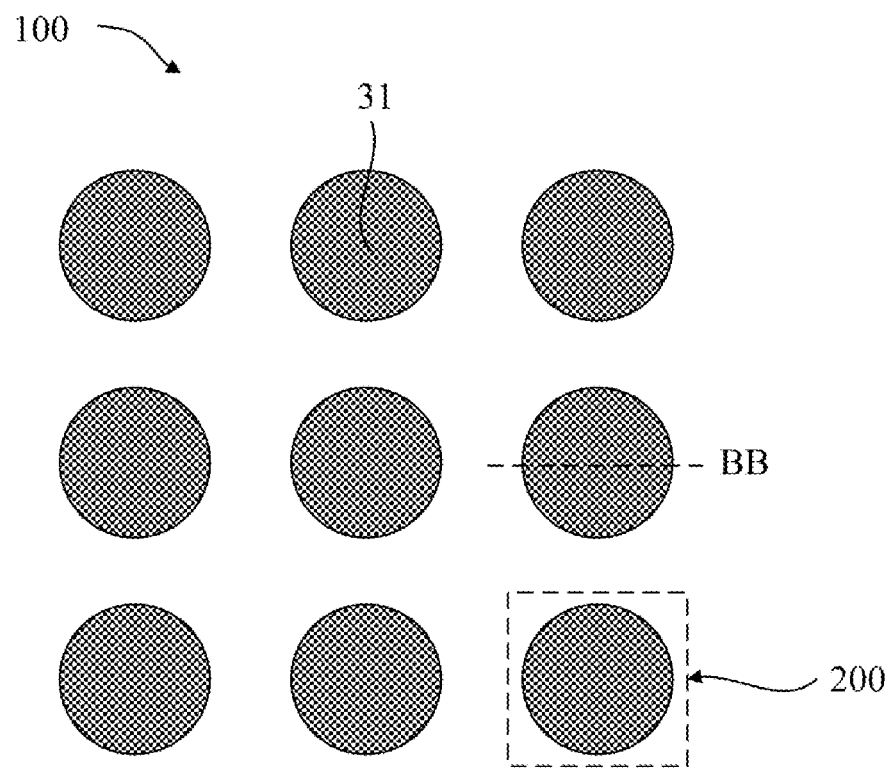
FIG. 4 is an arrangement diagram of a third type of pixel structure of a display panel of the present application.

Referring to FIG. 4, the first sub-pixel 31 may include the first light-emitting device 21, the second light-emitting device 22, and the third light-emitting device 23, all of which are arranged in a stack.

In this embodiment, the first sub-pixels 31 may be arranged in an array on the display panel 100. The first light-emitting device 21, the second light-emitting device 22, and the third light-emitting device 23 are arranged in a stack. Therefore, one light-emitting repeating unit 200 is equivalent to one first sub-pixel 31.

In FIG. 5, FIG. 5 is a cross-sectional view of section BB in FIG. 4. The third light-emitting device 23 may be disposed on the second light-emitting device 22. The first sub-pixel includes: a first light-emitting device 21, a second light-emitting device 22 arranged on the first light-emitting device 21, and a third light-emitting device 23 arranged on the second light-emitting device 22. An area occupied by the first sub-pixel 31 is further reduced. That is, if the structure in FIG. 3 is adopted, the pixel density (pixels per inch, PPI) of the display panel 100 will increase by one third. If the structure in FIG. 5 is adopted, the pixel density of the display panel 100 will be further increased.

Refer to FIG. 5, in a light-emitting direction of the display panel 100, the display panel 100 further includes a third anode layer 231 and a third cathode layer 232 disposed on both sides of the third light-emitting device 23. The third anode layer 231 is disposed on the third light-emitting device 23. The third cathode layer 232 is disposed between the second anode layer 221 and the third light-emitting device 23. In order to avoid a short connection between the third cathode layer 232 and the second anode layer 221, an inorganic insulating layer 25 is further provided between the third cathode layer 232 and the third anode layer 231.

In this embodiment, the second anode layer 221 and the third anode layer 231 need to input voltage signals to corresponding light-emitting devices, and the voltage continues to change. Therefore, if a distance between the second anode layer 221 and the third anode layer 231 is too small, a parasitic capacitance generated by the two will affect a voltage signal of the second anode layer 221 and the third anode layer 231, resulting the input voltage signal to appear abnormal. That is, in the present application, the third anode layer 231 is arranged away from the second anode layer 221, which avoids a technical problem of interference of the voltage signals input from the second anode layer 221 and the third anode layer 231.

In this embodiment, the array substrate 10 may further include a third thin film transistor 15. The third anode layer 231 is connected to the third thin film transistor 15 through a third via hole 151. The third via hole 151 penetrates a second portion of the pixel definition layer 40 and extends to the inside of the array substrate 10.

Referring to FIG. 5, the third anode layer 231 is disposed on the second anode layer 221. Therefore, a depth of the third via hole 151 will be greater than the depth of the second via hole 141. The third anode layer 231 is connected to the third thin film transistor 15 through a third via hole 151. Therefore, in order to prevent the third anode layer 231 from being disconnected on a surface of the third via hole 151, an inclination angle of the third via hole 151 needs to be greater than the inclination angle of the second via hole 141, such that the metal material formed in the third via hole 151 is a continuous third anode layer 231.

In the display panel 100 of the present application, the inclination angle of the third via hole 151 is greater than the inclination angle of the second via hole 141. If the distance between the third via hole 151 and the second via hole 141 is too small, it will cause a technical problem of interference between the third anode layer 231 in the third via hole 151 and the second anode layer 221 in the second via hole 141.

Referring to FIG. 5, in this embodiment, the second via hole 141 and the third via hole 151 are arranged on both sides of the first via hole 131. The distance between the second via hole 141 and the third via hole 151 is increased to avoid a technical problem of interference of the metal material in the via hole.

In this embodiment, when the display panel 100 is a top emission type, the transmittance of the third anode layer 231 is less than the transmittance of the first anode layer 211. When the display panel 100 is a bottom emission type, the transmittance of the third anode layer 231 is greater than the transmittance of the first anode layer 211, that is, the third anode layer 231 is made of a total reflection material. The first light-emitting device 21, the second light-emitting device 22, and the third light-emitting device 23 may form a multi-dimensional microcavity efficiency. The transmittance of the anode layer and the cathode layer between the first anode layer 211 and the third anode layer 231 can be adjusted according to requirements, as long as the transmittance corresponding to the microcavity effect is satisfied.

In this embodiment, similar to the structure in FIG. 3, due to inherent characteristics of the luminescent material, the luminous efficiency and luminous life of the red light-emitting device, the green light-emitting device, and the blue light-emitting device are all different. In the structure shown in FIG. 5, the first light-emitting device 21 and the second light-emitting device 22 may be a red light-emitting device and a green light-emitting device that are different from each other, and the third light-emitting device 23 may be a blue light-emitting device.

In this embodiment, the light-emitting color of the first light-emitting device 21 is controlled by the input voltage of the first anode layer 211 and the first cathode layer 212, the light-emitting color of the second light-emitting device 22 is controlled by the input voltage of the first cathode layer 212 and the second anode layer 221, and the light-emitting color of the third light-emitting device 23 is controlled by the input voltage of the third cathode layer 232 and the third anode layer 231. Therefore, the first thin film transistor 13, the second thin film transistor 14, and the third thin film transistor 15 can be individually controlled, i.e., the display of the display panel can be realized.

In this embodiment, the material of the anode layer and the cathode layer can be but not limited to metal or metal oxide. The material of the hole injection layer 201, the hole transport layer 202, the electron blocking layer 203, the hole blocking layer 205, the electron transport layer 206, and the electron injection layer 207 may be, but not limited to, organic small molecule materials.

Referring to FIGS. 3 and 5, the display panel 100 further includes a light extraction layer 50 (capping Layer, CPL) disposed on the light-emitting function layer 20. The material of the light extraction layer 50 may include an inorganic material having a high refractive index and a small light absorption coefficient, such as materials with a refractive index of 2 to 2.5. The light extraction layer 50 is used to improve the light extraction efficiency of the display panel 100.

In the above embodiment, the encapsulation layer 30 may be a thin film encapsulation layer, which may include a first inorganic layer; a first organic layer located on the first inorganic layer; and a second inorganic layer located on the first organic layer. The specific structure will not be repeated here.

The present application also proposes a display module, wherein the display module includes the above-mentioned display panel, a polarizer layer provided on the display panel, and a cover layer provided on the polarizer layer.

This application also provides a display device, which includes the display module. The display device includes, but is not limited to, mobile phones, tablet computers, computer monitors, game consoles, televisions, display screens, wearable devices, and other household appliances or household appliances with display functions.

A working principle of the display module and the electronic device is similar to a working principle of the display panel. For the working principle of the display module and the working principle of the electronic device, the working principle of the touch substrate can be referred to, which will not be repeated here.

The present application comprises a display panel and a display module. The display panel comprises a plurality of first light-emitting devices displaying a first color, a plurality of second light-emitting devices displaying a second color, and a plurality of third light-emitting devices displaying a third color, wherein the display panel comprises a plurality of light-emitting repeating units, and at least one first sub-pixel of each of the plurality of light-emitting repeating units comprises at least two of the first light-emitting devices, the second light-emitting devices, or the third light-emitting devices, all of which are arranged in a stack. In the present application, at least two stacked light-emitting devices with different light-emitting colors are arranged in a sub-pixel, such that a luminous brightness of the light-emitting device can be improved under a condition that the light-emitting area remains unchanged. A luminous efficiency of the light-emitting device is improved, and a service life of the display panel is prolonged.

It is understandable that for those of ordinary skill in the art, equivalent replacements or changes can be made according to the technical solution of the present application and its inventive concept. All these changes or replacements shall fall within the protection scope of the appended claims of this application.

The invention claimed is:

1. A display panel, comprising a plurality of first light-emitting devices displaying a first color, a plurality of second light-emitting devices displaying a second color, and a plurality of third light-emitting devices displaying a third color,
wherein the display panel comprises a plurality of light-emitting repeating units, and each of the light-emitting repeating units comprises:
at least one first sub-pixel, wherein the first sub-pixel comprises at least two of the first light-emitting devices, the second light-emitting devices, or the third light-emitting devices, all of which are arranged in a stack;
wherein the first sub-pixel includes the first light-emitting device and the second light-emitting device arranged in a stack, and the second sub-pixel includes the third light-emitting device,
wherein in a light-emitting direction of the display panel, transmittances of transmissive materials provided on both sides of the first light-emitting device and the second light-emitting device are different.

2. The display panel according to claim 1, wherein each of the light-emitting repeating units further comprises a second sub-pixel,
wherein the first sub-pixel is arranged at a center of a virtual rectangle, and the second sub-pixel is arranged in an area of the virtual rectangular and is close to a vertex of the virtual rectangle; or
the first sub-pixel and the second sub-pixel are arranged in the virtual rectangle, the first sub-pixel is arranged close to two vertices on a first oblique line in the virtual rectangle, the second sub-pixel is arranged close to two vertices on a second oblique line in the virtual rectangle, and the first oblique line and the second oblique line intersect.

3. The display panel according to claim 1, wherein the display panel comprises a first anode layer, the first light-emitting device provided on the first anode layer, a first cathode layer provided on the first light-emitting device, the second light-emitting device arranged on the first cathode layer, and a second anode layer arranged on the second light-emitting device,
wherein a transmittance of the first anode layer is less than transmittances of the first cathode layer and the second anode layer; or, a transmittance of the second anode layer is less than the transmittances of the first cathode layer and the first anode layer.

4. The display panel according to claim 1, wherein the display panel comprises an array substrate and a pixel definition layer provided on the array substrate, and the pixel definition layer is provided in a same layer as a plurality of sub-pixels;
wherein the array substrate at least comprises a first thin film transistor and a second thin film transistor, the first anode layer is connected to the first thin film transistor through a first via hole, and the second anode layer is connected to the second thin film transistor in the array substrate through a second via hole; and
wherein the first via hole is provided in the array substrate, and the second via hole penetrates through a first portion of the pixel definition layer and extends to an inside of the array substrate.

5. The display panel according to claim 1, wherein the third light-emitting device is spaced apart from the first light-emitting device and the second light-emitting device, wherein the first light-emitting device and the second light-emitting device are arranged in a stack;
wherein in the light-emitting direction of the display panel, a sum of a thickness of the first light-emitting device, the second light-emitting device, and a cathode layer on the second light-emitting device layer is equal to a thickness of the third light-emitting device.

6. The display panel according to claim 1, wherein in a top view direction of the display panel, a light-emitting area of the third light-emitting device is larger than a light-emitting area of the first light-emitting device or the second light-emitting device.

7. The display panel according to claim 1, wherein the first sub-pixel comprises the first light-emitting device, the second light-emitting device, and the third light-emitting device, all of which are arranged in a stack;
wherein the first sub-pixel is arranged in an array on the display panel.

8. The display panel according to claim 1, wherein thicknesses of the first light-emitting device, the second light-emitting device, and the third light-emitting device are different from each other.

9. The display panel according to claim 1, wherein a ratio of a sum of a thickness of each film layer in the first light-emitting device, the second light-emitting device, and the third light-emitting device to a wavelength of a corresponding light-emitting color is 0.5n:1, and n is a positive integer.

10. A display module, comprising a display panel, a polarizer layer provided on the display panel, and a cover layer provided on the polarizer layer,
wherein the display panel comprises a plurality of first light-emitting devices displaying a first color, a plurality of second light-emitting devices displaying a second color, and a plurality of third light-emitting devices displaying a third color; and
wherein the display panel comprises a plurality of light-emitting repeating units, and each of the light-emitting repeating units comprises:
at least one first sub-pixel, wherein the first sub-pixel comprises at least two of the first light-emitting devices, the second light-emitting devices, or the third light-emitting devices, all of which are arranged in a stack;
wherein the first sub-pixel includes the first light-emitting device and the second light-emitting device arranged in a stack, and the second sub-pixel includes the third light-emitting device,
wherein in a light-emitting direction of the display panel, transmittances of transmissive materials provided on both sides of the first light-emitting device and the second light-emitting device are different.

11. The display module according to claim 10, wherein each of the light-emitting repeating units further comprises a second sub-pixel,
wherein the first sub-pixel is arranged at a center of a virtual rectangle, and the second sub-pixel is arranged in an area of the virtual rectangular and is close to a vertex of the virtual rectangle; or
the first sub-pixel and the second sub-pixel are arranged in the virtual rectangle, the first sub-pixel is arranged close to two vertices on a first oblique line in the virtual rectangle, the second sub-pixel is arranged close to two vertices on a second oblique line in the virtual rectangle, and the first oblique line and the second oblique line intersect.

12. The display panel according to claim 11, wherein the display panel comprises a first anode layer, the first light-emitting device provided on the first anode layer, a first cathode layer provided on the first light-emitting device, the second light-emitting device arranged on the first cathode layer, and a second anode layer arranged on the second light-emitting device,
wherein a transmittance of the first anode layer is less than transmittances of the first cathode layer and the second anode layer; or, a transmittance of the second anode layer is less than the transmittances of the first cathode layer and the first anode layer.

13. The display panel according to claim 10, wherein the display panel comprises an array substrate and a pixel definition layer provided on the array substrate, and the pixel definition layer is provided in a same layer as a plurality of sub-pixels;
wherein the array substrate at least comprises a first thin film transistor and a second thin film transistor, the first anode layer is connected to the first thin film transistor through a first via hole, and the second anode layer is connected to the second thin film transistor in the array substrate through a second via hole; and
wherein the first via hole is provided in the array substrate, and the second via hole penetrates through a first portion of the pixel definition layer and extends to an inside of the array substrate.

14. The display panel according to claim 10, wherein the third light-emitting device is spaced apart from the first light-emitting device and the second light-emitting device, wherein the first light-emitting device and the second light-emitting device are arranged in a stack;
wherein in the light-emitting direction of the display panel, a sum of a thickness of the first light-emitting device, the second light-emitting device, and a cathode layer on the second light-emitting device layer is equal to a thickness of the third light-emitting device.

15. The display panel according to claim 10, wherein in a top view direction of the display panel, a light-emitting area of the third light-emitting device is larger than a light-emitting area of the first light-emitting device or the second light-emitting device.

16. The display module according to claim 10, wherein the first sub-pixel comprises the first light-emitting device, the second light-emitting device, and the third light-emitting device, all of which are arranged in a stack;
wherein the first sub-pixel is arranged in an array on the display panel.

17. The display module according to claim 10, wherein thicknesses of the first light-emitting device, the second light-emitting device, and the third light-emitting device are different from each other.

18. The display module according to claim 10, wherein a ratio of a sum of a thickness of each film layer in the first light-emitting device, the second light-emitting device, and the third light-emitting device to a wavelength of a corresponding light-emitting color is 0.5n:1, and n is a positive integer.

* * * * *